(12) United States Patent
Too

(10) Patent No.: US 6,870,258 B1
(45) Date of Patent: Mar. 22, 2005

(54) FIXTURE SUITABLE FOR USE IN COUPLING A LID TO A SUBSTRATE AND METHOD

(75) Inventor: Seah Sun Too, San Jose, CA (US)

(73) Assignee: Advanced Micro Devices, Sunnyvale, CA (US)

( * ) Notice: Subject to any disclaimer, the term of this patent is extended or adjusted under 35 U.S.C. 154(b) by 0 days.

(21) Appl. No.: 10/458,802

(22) Filed: Jun. 16, 2003

(51) Int. Cl.[7] .............................................. H01L 23/12
(52) U.S. Cl. ...................... 257/704; 257/723; 257/778; 257/726; 257/727; 257/E23.084
(58) Field of Search ................. 257/704, 723, 257/726, 727, 731, 732, 733, E23.084

(56) References Cited

U.S. PATENT DOCUMENTS

| | | | | |
|---|---|---|---|---|
| 5,424,919 A | * | 6/1995 | Hielbronner | 361/710 |
| 5,901,039 A | * | 5/1999 | Dehaine et al. | 361/704 |
| 5,907,474 A | | 5/1999 | Dolbear | |
| 5,926,371 A | | 7/1999 | Dolbear | |
| 6,160,710 A | * | 12/2000 | Ahl et al. | 361/707 |
| 6,181,006 B1 | * | 1/2001 | Ahl et al. | 257/712 |
| 6,219,244 B1 | * | 4/2001 | Chen | 361/704 |
| 6,297,960 B1 | * | 10/2001 | Moden et al. | 361/719 |
| 6,317,328 B1 | * | 11/2001 | Su | 361/704 |
| 6,377,061 B1 | * | 4/2002 | Settle et al. | 324/755 |
| 6,392,145 B1 | | 5/2002 | Andric | |
| 6,462,952 B1 | * | 10/2002 | Ubukata et al. | 361/719 |
| 6,504,243 B1 | | 1/2003 | Andric et al. | |
| 6,654,250 B1 | * | 11/2003 | Alcoe | 361/719 |

* cited by examiner

*Primary Examiner*—Jasmine Clark
(74) *Attorney, Agent, or Firm*—Paul Drake; Rennie Wm. Dover

(57) ABSTRACT

A fixture suitable for coupling a lid to a substrate having a semiconductor chip coupled thereto and a method for coupling the lid to the substrate. A support structure has a cavity having a floor and a pedestal protruding from the floor. A guide extends from the support structure. A compression mechanism is coupled to the guide wherein the compression mechanism includes an actuator plate coupled to a compression plate by a compressible means. An actuator is coupled to the compression mechanism. A packaging substrate having a semiconductor chip is mounted to the packaging substrate and a lid is mounted over the semiconductor chip to form a semiconductor component. The semiconductor component is placed on a support structure and the actuator is activated to urge the compression plate to apply a uniform force against the lid.

18 Claims, 3 Drawing Sheets

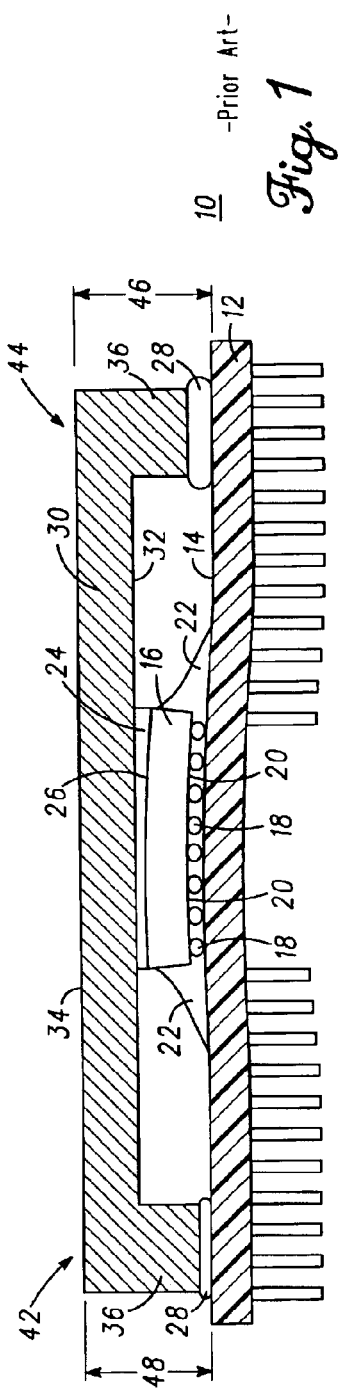
Fig. 1 -Prior Art-
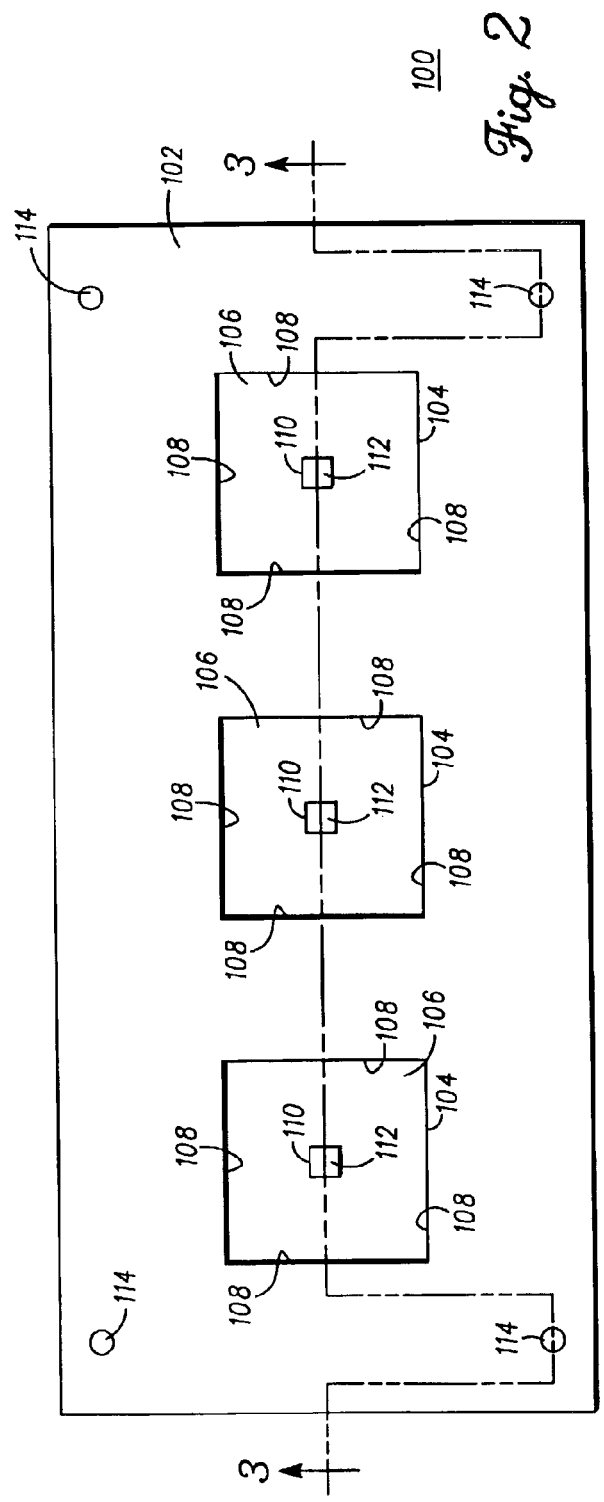
Fig. 2

FIXTURE SUITABLE FOR USE IN COUPLING A LID TO A SUBSTRATE AND METHOD

FIELD OF THE INVENTION

This invention relates, in general, to semiconductor components and, more particularly, to semiconductor components having lids and methods and fixtures for attaching the lids.

BACKGROUND OF THE INVENTION

In the manufacture of semiconductor components, processing steps such as photolithography, etching, doping, and passivation are referred to as front-end processing steps, whereas steps such as dicing, substrate mounting, and encapsulation are referred to as back-end processing steps. Thus, the steps up to and including passivation are the front-end steps and the steps from dicing to completion of the semiconductor component are the back-end steps. After completion of the back-end steps, the semiconductor components are subjected to a power cycling test in which they are electrically stressed to detect any defective semiconductor components. One type of defect caused by the back-end steps is excessive lid tilt. FIG. 1 illustrates a semiconductor component 10 having excessive lid tilt. What is shown in FIG. 1 is a pin grid array (PGA) substrate 12 having a major surface 14 on which a semiconductor chip 16 is flip-chip mounted. Solder bumps 18 that are formed on a top surface 20 of semiconductor chip 16 are bonded to bond pads (not shown) disposed on major surface 14 of PGA substrate 12. After bonding, an underfill material 22 is dispensed between semiconductor chip 16 and major surface 14. A thermal interface material 24 is disposed on a back surface 26 of semiconductor chip 16 and a lid adhesive 28 is dispensed on major surface 14. A lid 30 having an inner surface 32, an outer surface 34, and a lip 36 is positioned on lid adhesive 28 to form semiconductor component 10. Semiconductor component 10 is placed in a side-actuated or clam-shell clamp fixture (not shown) which applies an asymmetric force on lid 30, i.e., the force applied to one side 42 of lid 30 is greater than ta that applied to the other side 44 of lid 30. The clamp fixture housing PGA substrate 12, semiconductor chip 16, and lid 30 is placed in a curing oven to cure lid adhesive 28. Because the selected thermal interface material 24 is a phase change material, it does not cross link or polymerize but remains in a liquid state when the semiconductor chip is heated beyond the melting point of the phase change material. Typically, a phase change material has a melting point between 40 degrees Celsius (° C.) and 80° C. A drawback of the clam-shell clamp fixture is that it causes lid tilt by applying an uneven force to lid 30, which lid tilt exceeds specified tolerances. In other words, the distance indicated by arrows 46 exceeds the distance indicated by arrows 48 by more than an acceptable amount. Lid tilt becomes an even greater problem when the clamp fixture is adapted to accept multiple semiconductor components 10. One consequence of excessive lid tilt arises during power cycling of semiconductor components 10. During power cycling semiconductor chip 16 generates heat which is transferred to PGA substrate 12, underfill material 22, and lid adhesive 28. Because PGA substrate 12, semiconductor chip 16, underfill material 22, and lid adhesive 28 have different coefficients of thermal expansion, the heat generated by semiconductor chip 16 causes movement between semiconductor chip 16 and lid 30. This movement squeezes out thermal interface material 24 that is between semiconductor chip 16 and lid 30. The amount of thermal interface material 24 that is squeezed out is increased by lid 30 being uneven. The squeezing out of thermal interface material 24 decreases the amount of material between semiconductor chip 16 and lid 30, thereby increasing the thermal resistance therebetween. Thus, heat is not effectively removed from semiconductor chip 16 through lid 30 which may result in thermal failure of semiconductor chip 16.

Accordingly, what is needed is a method for manufacturing a semiconductor component capable of dissipating heat, a fixture for manufacturing the semiconductor component, and a method for manufacturing the fixture.

SUMMARY OF THE INVENTION

The present invention satisfies the foregoing need by providing a lid attachment fixture for use in coupling a lid to a semiconductor chip, a method for manufacturing the lid attachment fixture, and a method for manufacturing a semiconductor component. In accordance with one aspect, the present invention comprises a lid attachment fixture for use in coupling a lid to a semiconductor chip. The lid attachment fixture includes a support structure having a major surface and a recessed region having a sub-surface and sidewalls. The recessed region extends into the support structure. A guide extends from the major surface. An elastic compression mechanism capable of applying a substantially uniform force to the lid is coupled to the guide.

In accordance with yet another aspect, the present invention comprises a method for manufacturing a semiconductor component. A partially completed semiconductor component is provided. A lid is coupled to the partially completed semiconductor component by evenly applying pressure across a surface of the lid.

In accordance with yet another embodiment, the present invention includes a method for manufacturing a fixture suitable for use in coupling a lid to a substrate having a semiconductor chip disposed thereon. A structure having a major surface and a recessed region having a subsurface and sidewalls is manufactured. A guide is coupled to the support structure. An elastic compression mechanism is coupled to the guide, wherein the elastic compression mechanism is capable of applying a substantially uniform force to the lid.

BRIEF DESCRIPTION OF THE DRAWINGS

The present invention will be better understood from a reading of the following detailed description, taken in conjunction with the accompanying drawing figures, in which like reference numbers designate like elements and in which:

FIG. 1 is a cross-sectional side view of a prior art lidded semiconductor component;

FIG. 2 is a top view of a portion of a fixture for attaching a lid to a substrate in accordance with an embodiment of the present invention;

DETAILED DESCRIPTION

Figure 3:
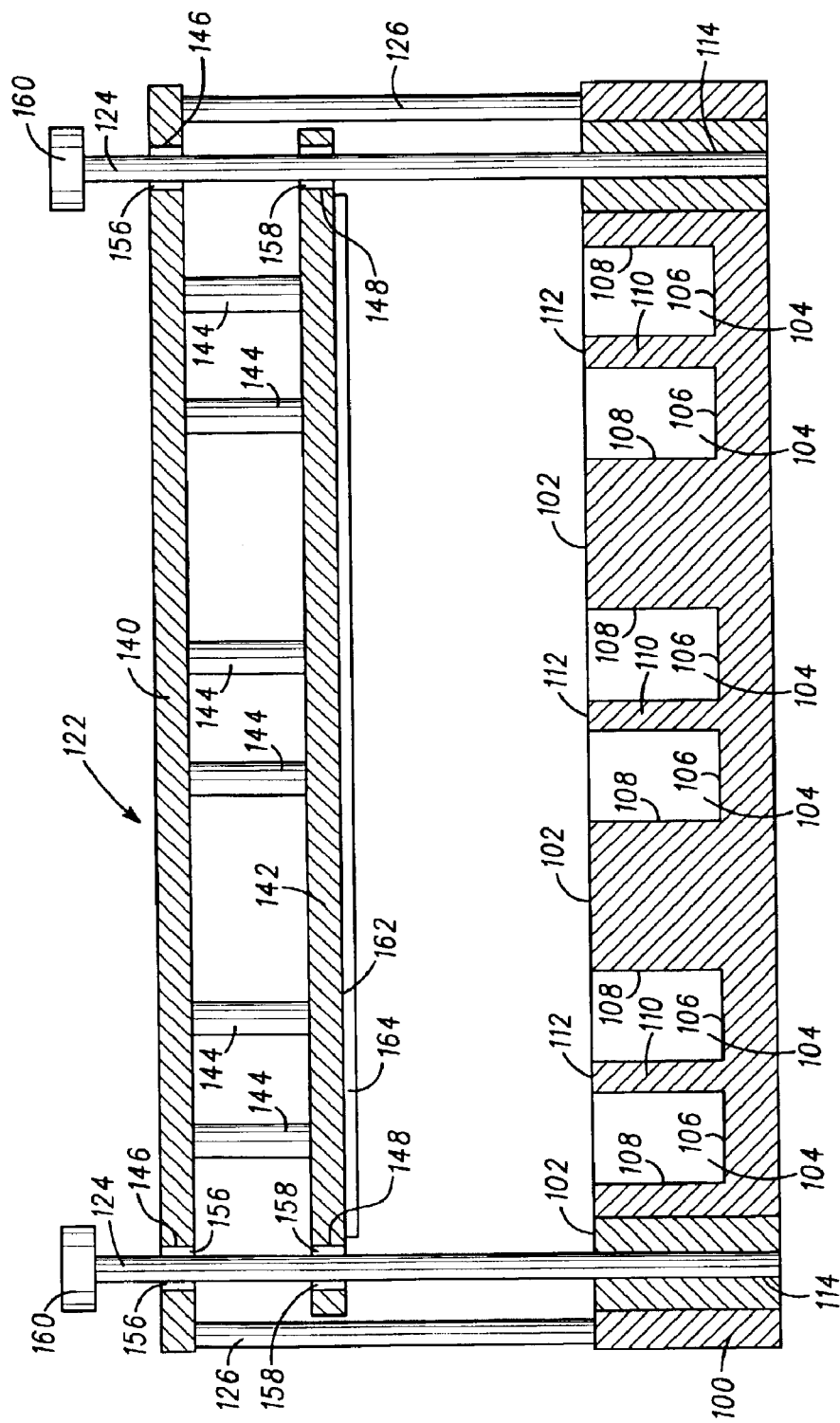
FIG. 3 is a cross-sectional side view of a fixture for attaching a lid to a substrate including the portion of the fixture shown in FIG. 2.

Generally, the present invention provides a method and a fixture for coupling a lid to a semiconductor chip and a method for manufacturing a semiconductor chip having a lid coupled thereto. In accordance with an embodiment of the present invention, a fixture is provided that has a support structure coupled to an elastic compression mechanism. When the fixture is in an open configuration, the compression mechanism is spaced apart from the support structure so that a semiconductor component can be placed in the fixture. In this embodiment, the support structure includes a plate having openings formed therein and pedestals extending from the cavity. The pedestals are positioned to contact portions on the semiconductor component underlying the chip receiving areas. The semiconductor component includes a thermal interface material positioned between the back surface of a semiconductor chip and the lid. When the elastic compression mechanism is actuated, an actuator presses or urges a compression plate against the lid and places the fixture in a closed position. Because the compression plate has a compressible material disposed on a surface of a stainless steel plate and the actuator includes an elastic actuating mechanism, a uniform pressure is exerted on the lid. This uniform pressure minimizes the amount of thermal interface material that may be squeezed out from between the semiconductor chip and the lid as well as ensuring the thickness of the thermal interface material is uniform.

FIG. 2 is top view of a portion 100 of a support structure 100 used in attaching lids or caps to semiconductor component packages. What is shown in FIG. 2 is a rectangular-shaped support structure or base 100 having a major surface 102. A plurality of square-shaped cavities 104 extend from major surface 102 into support structure 100. Cavities 104 are also referred to as recesses, package receiving areas, or semiconductor component receiving areas. Cavities 104 have cavity surfaces 106 and sidewalls 108. Square-shaped pedestals 110 having pedestal surfaces 112 extend upward from cavity surfaces 106. By way of example, support structure 100 is made from stainless steel. It should be understood that the shapes of support structure 100 and cavities 104 are not limitations of the present invention. Accordingly, support structure 100 and cavities 104 can be, among other shapes, rectangular; support structure 100 can be square and cavities 104 square or rectangular; or support structure 100 and cavities 104 can have other geometric shapes such as, for example, circles, triangles, pentagons, etc. Holes 114 for mating with guides are formed adjacent the corners of support structure 100. Techniques for forming cavities and holes in stainless steel are known to those skilled in the art. Although support structure 100 is shown as having three cavities 104 containing pedestals 112, it should be understood this is not a limitation of the present invention. There can be more than or fewer than three cavities 104 containing pedestals 112. Preferably, support structure 100 has ten cavities 104 containing pedestals 112.

Referring now to FIG. 3, a cross-sectional side view of a lid attachment fixture 120 in an "open configuration" is shown. Lid attachment fixture 120 includes a support structure 100 operatively coupled to an elastic or pliable compression mechanism 122 by guides 124 and an actuator 126. FIG. 3 illustrates support structure 100 along section line 3—3 of FIG. 2. More particularly, FIG. 3 illustrates cavities 104 extending from major surface 102 into support structure 100, wherein cavities 104 have cavity surfaces 106 and sidewalls 108. Cavity surfaces 106 are also referred to as the floors of cavities 104 or sub-surfaces. Pedestals 110 having pedestal surfaces 112 extend upward from cavity floors 106. Preferably pedestal surfaces 112 are co-planar with major surfaces 102. Although support structure 100 is shown as a unitary structure, it should be understood this is not a limitation of the present invention. Thus, structures may be mounted to a plate to form cavities having pedestals extending upward therefrom.

Elastic compression mechanism 122 comprises an actuator plate 140 coupled to a compression plate 142 by an elastic means 144. Preferably, actuator plate 140 and compression plate 142 are rectangularly-shaped stainless steel plates each having four corners and an alignment hole corresponding to each corner, i.e., each plate preferably has four alignment holes wherein one alignment hole is associated with a corresponding corner of the plate. Actuator plate 140 has alignment holes 146 associated with corresponding corners and compression plate 142 has alignment holes 148 associated with corresponding corners.

Guides 124 are inserted into holes 114. Guides 124 may be secured in holes 114' using a frictional fit or using adhesives or other fastening techniques. Guides 124 are inserted into corresponding alignment holes 148 and 146. Because elastic compression mechanism 122 moves along guides 124 when opening or closing lid attachment fixture 120, bearings 156 are placed in alignment holes 146 of actuator plate 140 and bearings 158 are placed in alignment holes 148 of compression plate 142. Bearings 156 and 158 reduce or minimize friction during opening or closing of lid attachment fixture 120. It should be understood that the material and shapes of actuator plate 140 and compression plate 142 are not limitations of the present invention. Other suitable shapes for plates 140 and 142 include square, circular, triangular, pentagonal, hexagonal, etc. Other suitable materials for plates 140 and 142 include aluminum and toolsteel. Likewise, the means for reducing friction is not a limitation of the present invention. For example, bushings or other suitable means can be used to reduce friction during opening and closing. Stops 160 are attached to the ends of guides 124 to prevent lid attachment fixture 120 and compression mechanism 122 from becoming separated.

Still referring to FIG. 3, elastic means 144 are, for example, coined springs. Other suitable means for allowing compliance or flexibility between actuator plate 140 and compression plate 142 include leaf springs or the like.

To further increase the elasticity of compression mechanism 122, an elastic material 162 is disposed on a contact surface 160 of compression plate 142. By way of example, elastic material 162 is silicone rubber.

Actuators 126 are coupled to support structure 100 and to elastic compression mechanism 122. By way of example, actuators 126 are coined springs that are stiff enough to keep lid attachment fixture 120 in an open configuration to facilitate loading of packages and lids. In addition, actuator 126 includes an external pneumatic press to clamp the fixture and latches to hold compression plate 142 in position so that a predetermined pressure can be evenly applied across compression plate 142.

Figure 4:
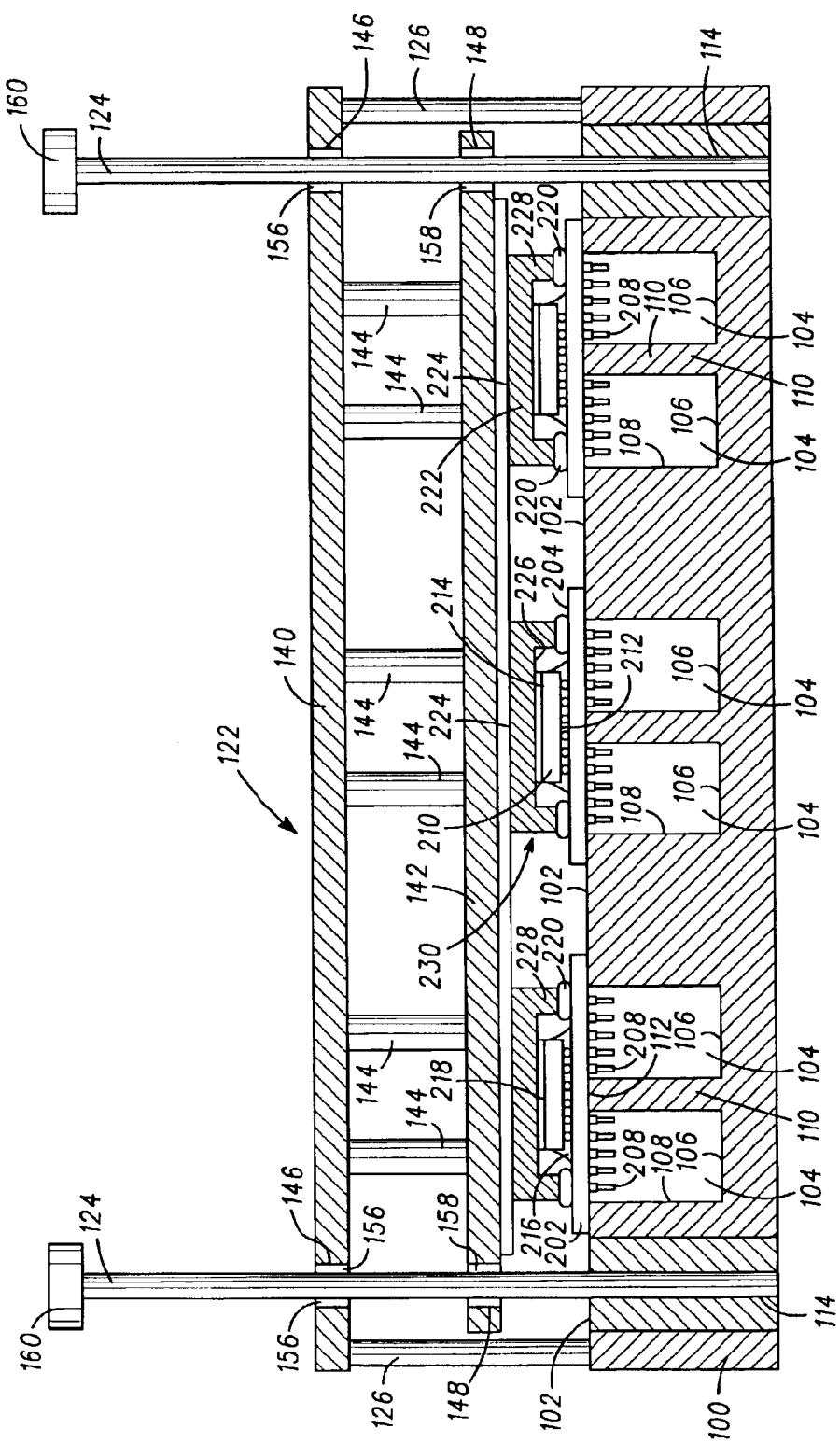
FIG. 4 is a cross-sectional side view of a semiconductor component during manufacture in accordance with an embodiment of the present invention.

Referring now to FIG. 4, lid attachment fixture 120 in a closed configuration and containing semiconductor components 230 is shown. By way of example, semiconductor components 230 include pin grid array (PGA) structures 202 having a chip or die receiving surface 204 and a pin extension surface 206. It should be understood the present invention is not limited to pin grid array structures but may include, for example, ball grid array (BGA) structures, ceramic packages, plastic packages, or the like. Pins 208 extend from pin extension surface 206. A semiconductor die or chip 210 having a bumped surface 212 and a back surface 214 is flip-chip mounted to a chip receiving area on die receiving surface 204 and an underfill material 216 is dispensed between semiconductor chip 210 and chip receiving surface 204. A thermal interface material 218 is disposed on back surface 214. The coefficient of thermal expansion of semiconductor chips 210 is such that they are non-planar or warped at room temperature. Thermal interface material 218 helps to compensate for the surface warpage across surface 214 of semiconductor die 210. Preferably, thermal interface material 218 is a thermally conductive material such as, for example, a thermal grease, a thermal phase change material, or a thermal gel. A lid adhesive 220 is disposed on each die receiving surface 204 such that it surrounds semiconductor chips 210. Lids or caps 222 each having an outer surface 224, an inner surface 226, and a lip 228 are placed in lid adhesive 220, thereby sealing lids 222 to PGA substrates 202, which sealing prevents contaminants such as, for example, moisture from damaging semiconductor chips 210. Suitable materials for lid 222 include copper, aluminum, aluminum silicon carbide, or the like. Lids 222 protect semiconductor chips 210 from physical and environmental stresses.

Semiconductor components 230 are placed in lid attachment fixture 120. Actuators 126 are activated to apply a vertical force to elastic compression mechanism 122 and move it towards major surfaces 102 and 112. Guides 124 maintain parallelism between plates 140 and 142 and major surfaces 102 and 112 and the vertical force ensures that an even pressure is applied to all the lids in lid attachment fixture 120, i.e., the three lids shown in FIG. 4. Bearings 156 and 158 reduce friction between the respective plates 140 and 142 and guides 124. When elastic material 162 of elastic compression mechanism 122 contacts the outer surfaces 224 of lids 222, lids 222 are pressed into lid adhesive 220. Elastic material 162 absorbs any package and lid thickness variation. In addition, pillars 110 and the portions of major surface 102 adjacent cavities 104 ensure support structure 202 remains substantially planar as compression mechanism 122 applies a force or pressure to semiconductor components 230.

Lid attachment fixture 120 containing semiconductor components 230 is placed in a curing oven to cure lid attachment material 220. Curing causes lid attachment material 220 to transition to a solid state. Because surfaces 224 of lids 222 have an even pressure applied against them during the curing process, surfaces 212 and 224 remain substantially parallel to each other after curing, i.e., lid tilt is kept to less than about sixty micrometers.

After curing, semiconductor components 230 undergo a power cycling process that heats and cools semiconductor components 230. During power cycling, as semiconductor chips 210 are heated and cooled, PGA substrate 202, cured underfill material 216, cured lid attachment material 220, lids 222, as well as semiconductor chips 210 expand and contract at different rates because they have different coefficients of thermal expansion. Thermal interface material 218 is a phase change material which does not cure during the curing process, but remains in a liquid state over the transition temperature. Because the tilt of lid 220 is maintained at less than about sixty micrometers, the amount of thermal interface material that is squeezed out is insufficient to significantly increase the thermal resistance between semiconductor chips 210 and lids 222. The thermal interface between semiconductor chips 210 and lids 222 permits dissipation of the heat from semiconductor chips 210. Thus, a low thermal resistance at the interface between semiconductor chips 210 and lids 222 allows a substantial amount of heat to be dissipated from semiconductor chips 210.

By now it should be appreciated that a lid attachment fixture for attaching a lid to a support structure, a method for attaching the lid to the support structure, and a semiconductor component having a lid attached to a support structure have been provided. In accordance with the present invention, the lid attachment fixture comprises a support structure coupled to an elastic compression mechanism by guides and an actuator and is adapted to receive one or more semiconductor components. In one embodiment, the semiconductor components are pin grid array packages on which semiconductor chips and lids are mounted. A thermal interface material is dispensed between the lid and the semiconductor chip and a lid attachment adhesive is dispensed between the lid and the pin grid array substrate. The lid attachment fixture applies a substantially uniform pressure across the lid thereby holding the lid in place while the lid adhesive material is being cured. Further, the substantially uniform pressure applied to the lid ensures that the lid, the semiconductor chip, and the packaging substrate remain parallel during the curing stage. In other words, the substantially uniform pressure substantially reduces lid tilt, i.e., it keeps lid tilt to less than about sixty micrometers. Thus, when the package undergoes thermal stresses causing the different elements to expand or contract at different rates due to mismatches in coefficients of thermal expansion, the amount of thermal interface material that is squeezed out from between the semiconductor chip and the lid is insufficient to increase the thermal resistance between the semiconductor chips and the lids.

Another advantage of the present invention is that because pressure is applied uniformly across the lid, the size of the lid attachment fixture is not limited by the pressure application mechanism. In other words, in conventional clamshell style lid attachment fixtures, pressure is applied beginning at one side of the lid and continuing across the lid surface. This approach squeezes out the thermal interface material, thereby increasing the thermal resistance between the semiconductor chip and the lid. This problem is compounded when the clam-shell style lid attachment is configured to hold more than one semiconductor component. In accordance with the present invention, the application of a uniform pressure reduces the amount of thermal interface material squeezed out from between the lid and the semiconductor chip and it maintains the thermal interface material at a substantially uniform thickness. Thus, a substantially uniform thermal resistance is maintained across the back surfaces of the semiconductor chips. Because of the uniform thermal resistance, isolated hot spots do not appear in the semiconductor chips which cause them to fail.

Although certain preferred embodiments and methods have been disclosed herein, it will be apparent from the foregoing disclosure to those skilled in the art that variations and modifications of such embodiments and methods may be made without departing from the spirit and scope of the invention.

What is claimed is:

1. A lid attachment fixture, comprising:
   a support structure having a major surface and a recessed region having a sub-surface and sidewalls, the recessed region extending into the support structure;
   a guide extending from the major surface; and
   an elastic compression mechanism coupled to the guide, the elastic compression mechanism capable of applying a substantially uniform force to a lid.

2. The lid attachment fixture of claim 1, wherein the support structure is rectangular and has four corners, and further including four pillars, one adjacent each corner of the rectangular support structure.

3. The lid attachment fixture of claim 1, further including a support pillar extending from the sub-surface of the recessed region.

4. The lid attachment fixture of claim 1, wherein the elastic compression mechanism comprises:
- an actuator plate;
- a compression plate; and
- an elastic coupling mechanism coupled between the actuator plate and the compression plate.

5. The lid attachment fixture of claim 4, wherein the compression plate comprises a rigid plate having a surface and a compressive material coupled to the surface.

6. The lid attachment fixture of claim 5, wherein the compression plate is stainless steel and the compressive material is silicone rubber.

7. The lid attachment fixture of claim 4, wherein the elastic coupling mechanism comprises a plurality of springs.

8. The lid attachment fixture of claim 7, wherein the elastic compression mechanism further comprises a release spring coupled to the actuator plate.

9. A fixture for use in manufacturing a semiconductor component, comprising:
- a support structure having a major surface and a cavity extending from the major surface into the support structure, wherein the cavity has sidewalls and a cavity surface;
- a plurality of protrusions extending from the major surface; and
- a compression structure coupled to at least one of the plurality of protrusions, wherein the compression structure and the at least one of the plurality of protrusions cooperate to transmit a uniform pressure from the compression structure.

10. The fixture of claim 9, wherein the support structure comprises a stainless steel plate.

11. The fixture of claim 10, wherein the support structure has a rectangular shape.

12. The fixture of claim 9, wherein the support structure has a rectangular shape and the plurality of protrusions comprises four protrusions, and wherein one protrusion is adjacent each corner of the support structure.

13. The fixture of claim 9, wherein the cavity has a square shape.

14. The fixture of claim 9, wherein the compression structure comprises a rigid plate having a compliant material coupled thereto.

15. The fixture of claim 9, further including a pedestal extending from the cavity surface.

16. The fixture of claim 9, wherein the compression structure comprises an actuator plate coupled to a compression plate.

17. The test fixture of claim 16, wherein the actuator plate is coupled to the compression plate by a plurality of springs.

18. The test fixture of claim 17, wherein the plurality of springs comprises coined springs.

* * * * *